United States Patent
Annunziata et al.

(10) Patent No.: US 9,705,071 B2
(45) Date of Patent: Jul. 11, 2017

(54) STRUCTURE AND METHOD TO REDUCE SHORTING AND PROCESS DEGRADATION IN STT-MRAM DEVICES

(71) Applicant: International Business Machines Corporation, Armonk, NY (US)

(72) Inventors: Anthony J. Annunziata, Stamford, CT (US); Gen P. Lauer, Yorktown Heights, NY (US); Janusz J. Nowak, Highland Mills, NY (US); Eugene J. O'Sullivan, Nyack, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/950,830

(22) Filed: Nov. 24, 2015

(65) Prior Publication Data

US 2017/0148976 A1    May 25, 2017

(51) Int. Cl.
*H01L 43/02* (2006.01)
*H01L 43/08* (2006.01)
*H01L 43/12* (2006.01)

(52) U.S. Cl.
CPC .............. *H01L 43/02* (2013.01); *H01L 43/08* (2013.01); *H01L 43/12* (2013.01)

(58) Field of Classification Search
CPC ........................... H01L 27/228; H01L 27/222
USPC ....................... 438/3; 257/E27.005, E21.002
See application file for complete search history.

(56) References Cited

U.S. PATENT DOCUMENTS

| | | |
|---|---|---|
| 6,358,756 B1 | 3/2002 | Sandhu et al. |
| 6,521,931 B2 | 2/2003 | Sandhu et al. |
| 6,969,895 B2 | 11/2005 | Han et al. |
| 7,241,632 B2 | 7/2007 | Yang |
| 7,645,618 B2 | 1/2010 | Ditizio |
| 7,880,249 B2 | 2/2011 | Yuan et al. |
| 8,273,582 B2 | 9/2012 | Nozieres et al. |
| 8,289,757 B2 | 10/2012 | Keshtbod et al. |

(Continued)

OTHER PUBLICATIONS

O'Sullivan, E.J.; "Magnetic Tunnel Junction-Based MRAM and Related Processing Issues"; RC23525 (W0502-076); Materials Science; p. 1-17; Feb. 14, 2005.

(Continued)

*Primary Examiner* — Jerome Jackson, Jr.
*Assistant Examiner* — Bo Fan
(74) *Attorney, Agent, or Firm* — Cantor Colburn LLP; Vazken Alexanian

(57) ABSTRACT

A method of making a magnetic random access memory device includes forming a magnetic tunnel junction (MTJ) on an electrode, the MTJ including a reference layer, a tunnel barrier layer, and a free layer; disposing a hard mask on the MTJ; etching sidewalls of the hard mask and MTJ to form a stack with a first width and redeposit metal along the MTJ sidewall; depositing a sacrificial dielectric layer on the hard mask, surface of the electrode, exposed sidewall of the hard mask and the MTJ, and on redeposited metal along the sidewall of the MTJ; removing a portion of the sacrificial dielectric layer from sidewalls of the hard mask and MTJ and redeposited metal from the MTJ sidewalls; and removing a portion of a sidewall of the MTJ and hard mask to provide a second width to the stack; wherein the second width is less than the first width.

8 Claims, 3 Drawing Sheets

(56) References Cited

U.S. PATENT DOCUMENTS

| | | |
|---|---|---|
| 8,334,213 B2 | 12/2012 | Mao |
| 8,574,928 B2 | 11/2013 | Satoh et al. |
| 8,883,520 B2 | 11/2014 | Satoh et al. |
| 2007/0181964 A1* | 8/2007 | Shoji .................... H01L 27/228 257/421 |
| 2010/0221848 A1 | 9/2010 | Keshtbod et al. |
| 2013/0267042 A1* | 10/2013 | Satoh .................... H01L 27/222 438/3 |
| 2013/0341801 A1 | 12/2013 | Satoh et al. |

OTHER PUBLICATIONS

Persson, Anderson, et al.; "Etch-Stop Technique for Patterning of Tunnel Junctions for a Magnetic Field Sensor"; J. Micromech. Microeng.; vol. 21; p. 1-8; 2011.

Takahashi, Shigeki, et al.; "Ion-Beam-Etched Profile Control of MTJ Cells for Improving the Switching Characteristics of High-Density MRAM"; IEEE Transactions on Magnetics; vol. 42, No. 10; p. 2745-2747; Oct. 2006.

\* cited by examiner

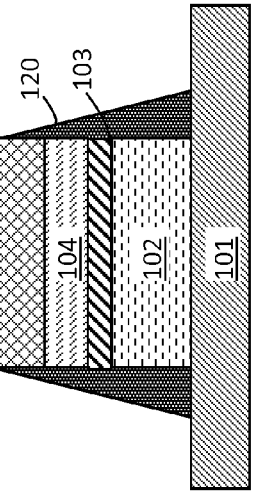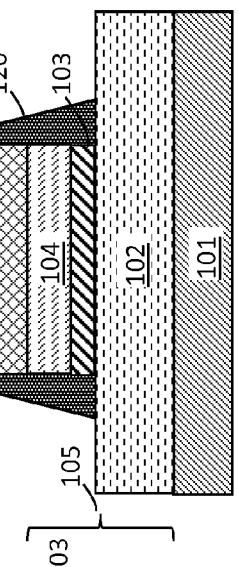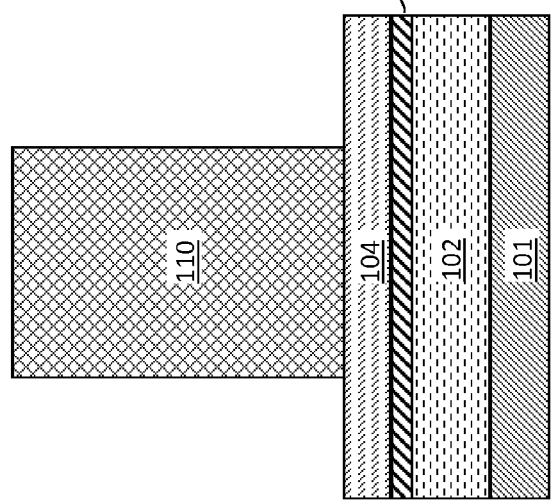

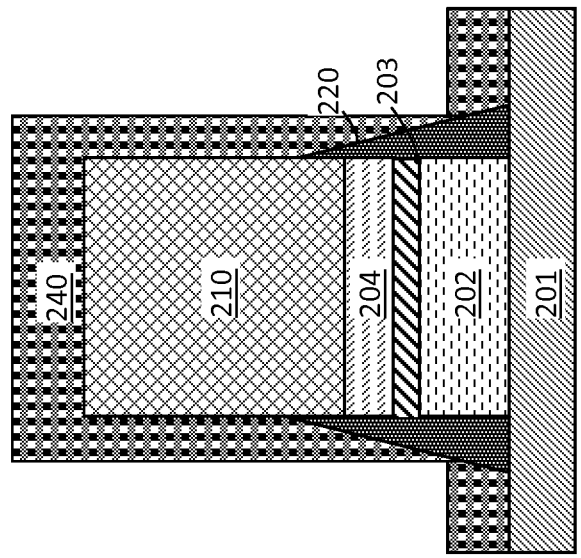
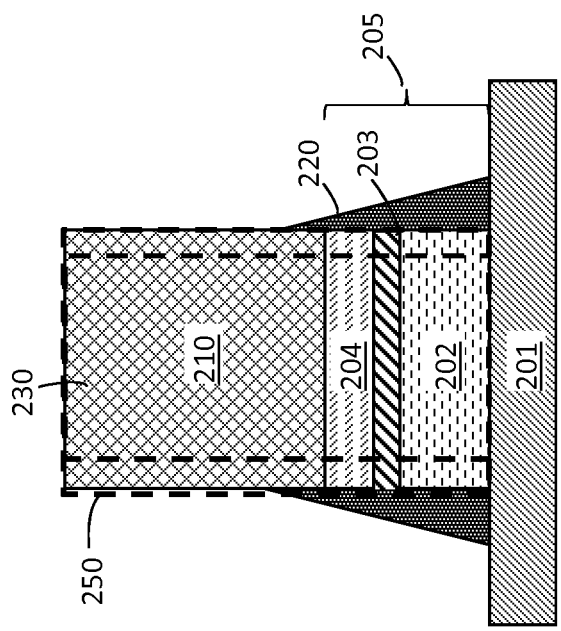
FIG. 2B
FIG. 2A

STRUCTURE AND METHOD TO REDUCE SHORTING AND PROCESS DEGRADATION IN STT-MRAM DEVICES

BACKGROUND

The present invention relates to spin-transfer torque magnetoresistive random access memory (STT-MRAM devices), and more specifically, to stack structures and etch processes in STT-MRAM devices.

STT-MRAM devices have some benefits over semiconductor-based memories, such as dynamic random-access memory (DRAM) and static random-access memory (SRAM). However, in order to compete with DRAM and SRAM, the STT-MRAM devices are integrated into the wiring layers of standard silicon logic and memory chips.

STT-MRAM device is a type of solid state, non-volatile memory that uses tunneling magnetoresistance (TMR or MR) to store information. MRAM includes an electrically connected array of magnetoresistive memory elements, referred to as magnetic tunnel junctions (MTJs). Each MTJ includes a free layer and fixed/reference layer that each includes a magnetic material layer. A non-magnetic insulating tunnel barrier separates the free and fixed/reference layers. The free layer and the reference layer are magnetically de-coupled by the tunnel barrier. The free layer has a variable magnetization direction, and the reference layer has an invariable magnetization direction.

An MTJ stores information by switching the magnetization state of the free layer. When magnetization direction of the free layer is parallel to the magnetization direction of the reference layer, the MTJ is in a low resistance state. Conversely, when the magnetization direction of the free layer is antiparallel to the magnetization direction of the reference layer, the MTJ is in a high resistance state. The difference in resistance of the MTJ may be used to indicate a logical '1' or '0', thereby storing a bit of information. The TMR of an MTJ determines the difference in resistance between the high and low resistance states. A relatively high difference between the high and low resistance states facilitates read operations in the MRAM.

SUMMARY

According to an embodiment, a method of making a magnetic random access memory (MRAM) device includes forming a magnetic tunnel junction (MTJ) on an electrode, the MTJ including a reference layer disposed in contact with the electrode, a tunnel barrier layer disposed on the reference layer, and a free layer disposed on the tunnel barrier layer; disposing a hard mask on the MTJ; etching sidewalls of the hard mask and the MTJ to form a stack with a first width and redeposit a metal along a sidewall of the MTJ; depositing a sacrificial dielectric layer on a surface of the hard mask, a surface of the electrode, an exposed sidewall of the hard mask and the MTJ, and on redeposited metal positioned along the sidewall of the MTJ; removing a portion of the sacrificial dielectric layer from sidewalls of the hard mask and the MTJ and the redeposited metal from sidewalls of the MTJ; and removing a portion of a sidewall of the MTJ and the hard mask to provide a second width to the stack; wherein the second width is less than the first width.

According to another embodiment, a method of making a magnetic random access memory (MRAM) device forming a magnetic tunnel junction (MTJ) on an electrode, the MTJ including a reference layer disposed in contact with the electrode, a tunnel barrier layer disposed on the reference layer, and a free layer disposed on the tunnel barrier layer; disposing a hard mask on the MTJ; etching sidewalls of the hard mask and the MTJ to form a stack with a first width and redeposit a metal along a sidewall of the MTJ; depositing a sacrificial dielectric layer on a surface of the hard mask, a surface of the electrode, an exposed sidewall of the hard mask and MTJ, and on redeposited metal positioned along the sidewall of the MTJ; performing a directional etch to remove a portion of the sacrificial dielectric layer from sidewalls of the hard mask and MTJ and the redeposited metal from sidewalls of the MTJ; and depositing an encapsulating dielectric layer on the sacrificial dielectric layer.

Yet, according to another embodiment, a magnetic random access memory (MRAM) device includes a magnetic tunnel junction (MTJ) positioned on an electrode, the MTJ including a reference layer positioned in contact with the electrode, a tunnel barrier disposed on the reference layer, and a free layer disposed on the tunnel barrier layer; a hard mask disposed on the free layer of the MTJ; and a sacrificial dielectric material disposed on a surface of the hard mask, a surface of the electrode, and a sidewall of a portion of the MTJ; wherein a portion of a sidewall of the hard mask is substantially free of the sacrificial dielectric material.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1A-1C illustrate methods of making MRAM devices that result in metal redeposition along sidewalls of the tunnel barrier; in which:

FIG. 1A is a cross-sectional side view of a patterned hard mask disposed on a MTJ stack;

FIG. 1B is a cross-sectional side view after etching the free layer and the tunnel barrier layer of the MTJ stack; and FIG. 1C is a cross-sectional side view after etching the reference layer of the MTJ stack;

FIGS. 2A-2C illustrate exemplary methods of making MRAM devices to remove metal redeposition according to various embodiments, in which:

FIG. 2A is a cross-sectional side view after patterning a hard mask and an MTJ stack on a contact electrode;

FIG. 2B is a cross-sectional side view after depositing a dielectric film on the patterned hard mask and MTJ stack; and FIG. 2C is a cross-sectional side view using a directional etch to remove material from the device sidewalls.

DETAILED DESCRIPTION

Figure 2D:
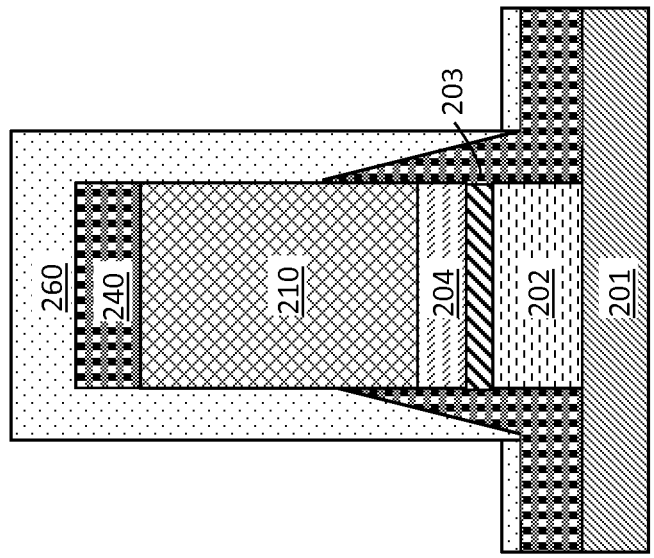
FIG. 2D is a cross-sectional side view after depositing an optional encapsulating dielectric layer on the MRAM device.

One challenge of integrating STT-MRAM devices into wiring layers of silicon logic and memory chips is subtractive etching of the magnetic stack from a blanket film. Specialized reactive ion etches (RIE) and inert ion beam etches (IBE) may be used. However, RIE processes for etching MRAM may cause device degradation. Although IBE processes may not induce as much magnetic damage, they may cause metal redeposition (described in FIGS. 1A-1C below) that can induce electrical shorting across the tunnel barrier layer. Shorting across the tunnel barrier layer may reduce device yields. Metal redeposition can be removed by oxidizing the redeposited metal to make it insulating, but the oxidation process may also cause device degradation.

For example, FIGS. 1A-1C illustrate methods of making MRAM devices that result in metal redeposition along sidewalls of the tunnel barrier layer 103. FIG. 1A is a cross-sectional side view of a patterned hard mask 110 disposed on a MTJ stack 105. The MTJ stack 105 includes a reference layer 102, a tunnel barrier layer 103, and a free layer 104. The reference layer 102 and the free layer 104 include conductive, magnetic metals or metal alloys. The MTJ stack 105 is disposed on a contact electrode 101 (bottom contact). A hard mask 110 is disposed on the MTJ stack 105. The hard mask 110 is then patterned.

FIG. 1B is a cross-sectional side view after transferring the pattern of the hard mask 110 into the free layer 104 and the tunnel barrier layer 103 of the MTJ stack 105. The free layer 104 and the tunnel barrier layer 103 are etched, by, for example, a RIE or IBE process. During the etch process, the magnetic material of the free layer 104 is redeposited along the sidewalls of the free layer 104, the tunnel barrier layer 103, and/or the hard mask 110.

FIG. 1C is a cross-sectional side view after etching the reference layer 102 of the MTJ stack 105. Etching the reference layer 104 results in even more magnetic material being deposited along the sidewalls of the MTJ stack 105, including along the reference layer 102 sidewalls. The redeposited magnetic material may induce shorting along the tunnel barrier 103.

Accordingly, various embodiments described herein, in contrast to FIGS. 1A-1C, provide MRAM devices and methods that substantially reduce or eliminate electrical shorting caused by metal redeposition in an etched MRAM device. The methods and devices also reduce process degradation. In some embodiments, an IBE patterns the device to a larger size than the final desired size. A sacrificial insulator may be deposited using a low power, low temperature plasma enhanced chemical vapor deposition (PECVD) or physical vapor deposition (PVD) process to encapsulate the device. The insulator may be, but is not limited to, silicon nitride, silicon dioxide, or aluminum oxide. A directional "clean-up" process etches the sidewalls of the device stack, substantially leaving the top surface of the stack intact. All of the processes may be performed in-situ in the same multi-chamber process tool. Accordingly, any redeposition from the substrate is a dielectric, which would not short the tunnel barrier like a redeposited metal. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 2C:
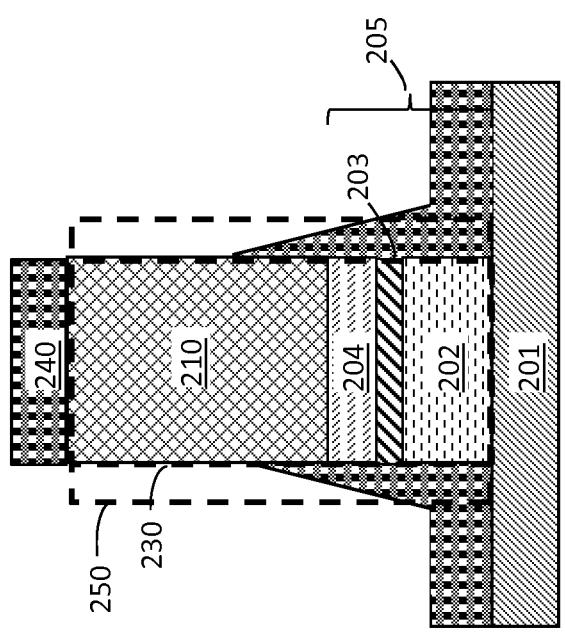

Turning again to the Figures, FIGS. 2A-2C illustrate exemplary methods of making MRAM devices according to various embodiments. FIG. 2A is a cross-sectional side view after patterning a hard mask 210 and an MTJ stack 205 on a contact electrode 201.

The contact electrode 201 includes a conductive material(s) and forms the bottom contact electrode of the MRAM device. Non-limiting examples of conductive materials for the contact electrode include tantalum, tantalum nitride, titanium, or any combination thereof.

The contact electrode 201 may be formed by depositing a conductive material(s) onto a surface. The conductive material(s) may be deposited by, for example, physical vapor deposition (PVD), ion beam deposition (IBD), atomic layer deposition (ALD), or like processes.

To form the MTJ stack 205, the reference layer 202 is formed on the contact electrode 201, the tunnel barrier layer 203 is formed on the reference layer 202, and the free layer 204 is formed on the tunnel barrier layer 103. The reference layer 202 and the free layer 204 include conductive, magnetic materials, for example, metals or metal alloys. The reference layer 202 and the free layer may be formed by employing a deposition process, for example, PVD, IBD, ALD, or other like processes.

The reference layer 202 and the free layer 204 may include one layer or multiple layers. The reference layer 202 and the free layer 204 may include the same materials and/or layers or different materials and/or layers. Non-limiting examples of materials for the reference layer 202 and/or the free layer 203 include iron, cobalt, boron, aluminum, nickel, silicon, oxygen, carbon, zinc, beryllium, vanadium, boron, magnesium, or any combination thereof.

The reference layer 202 has a thickness that may generally vary and is not intended to be limited. In some embodiments, the reference layer 202 has a thickness in a range from about 5 to about 25 nm. In other embodiments, the reference layer 202 has a thickness in a range from about 10 to about 15 nm.

The free layer 204 has a thickness that may generally vary and is not intended to be limited. In some embodiments, the free layer 204 has a thickness in a range from about 5 to about 25 nm. In other embodiments, the free layer 204 has a thickness in a range from about 10 to about 15 nm.

The tunnel barrier layer 203 includes a non-magnetic, insulating material. A non-limiting example of an insulating material for the tunnel barrier layer 203 includes magnesium oxide (MgO). The tunnel barrier layer 203 may be formed on the reference layer 202 by, for example, radiofrequency (RF) sputtering in some embodiments. Alternatively, the tunnel barrier layer 203 may be formed by oxidation (e.g., natural or radical oxidation) of a magnesium (Mg) layer deposited on the reference layer 202. After oxidation, the MgO layer may then be capped with a second layer of Mg.

A hard mask 210 material layer is disposed on the MTJ stack 205. The hard mask 210 material layer may include one or more conductive materials. The material forming the hard mask 210 may be deposited by employing a deposition process, for example, PVD, IBD, or other like processes. Non-limiting examples of conductive materials for the hard mask material layer include tantalum nitride, titanium, titanium nitride, or any combination thereof.

The hard mask material layer is then patterned by etching to form a patterned hard mask 210. The hard mask 210 material layer may be etched by, for example, employing a reactive ion etch (RIE) process or a halogen-based chemical etch process (e.g., including chlorine-containing gas and/or fluorine-containing gas chemistry). The hard mask 210 and the free layer 204 are etched at different rates such that initially the hard mask 210 is etched and the free layer 204 remains un-etched.

After etching the hard mask 210, the MTJ stack 205 is etched. The pattern from the hard mask 210 is transferred into the free layer 204, tunnel barrier layer 203, and reference layer 202. The free layer 204, tunnel barrier layer 203, and reference layer 202 are etched by, for example, performing a MRAM stack etch process. The stack etch process may be, for example, a RIE process or an IBE process. Etching the MTJ stack 205 does not substantially degrade the hard mask 310.

Because the MTJ stack 205 includes magnetic materials (e.g., metal or metal alloys), etching the MTJ stack 205 redeposits a portion of the magnetic material along a portion of the sidewall of the MTJ stack 205 (redeposition 220). The redeposition 220 may be deposited along a sidewall (or a portion of a sidewall) of the reference layer 202, tunnel barrier layer 203, free layer 204, and/or the hard mask 210.

The initial size 250 of the device (first width) will be reduced in subsequent steps (see FIG. 2C) to a final desired size 230 (second width). Thus the original width of the MTJ stack 205 and hard mask 210 should be slightly larger than desired in the final device. The second width of the final size 230 is less than the first width of the initial size 250. In some embodiments, the first width (initial size 250) is about 5 to about 40 nm larger than the second width (final desired size 230).

FIG. 2B is a cross-sectional side view after depositing a sacrificial dielectric film 240 (sacrificial dielectric layer) on the patterned hard mask 210 and MTJ stack 205. The sacrificial dielectric film 240 covers the contact electrode 201, MTJ stack 205, redeposition 220, and hard mask 210. The sacrificial dielectric film 240 is disposed on a surface of the hard mask 210 and directly in contact with exposed sidewalls of the hard mask 220 and MTJ 205.

Non-limiting examples of materials for the sacrificial dielectric film 240 include dielectric oxides (e.g., silicon dioxide), dielectric nitrides (e.g., $Si_xN_y$), dielectric oxynitrides (e.g., $SiO_xN_y$), aluminum oxides (e.g., $Al_xO_y$), or any combination thereof.

For better process control, the sacrificial dielectric film 240 may be deposited in situ (without breaking the chamber vacuum) after etching the MTJ stack 205, as shown in FIG. 2A. The sacrificial dielectric film 240 is deposited using a low temperature and low power plasma enhanced chemical vapor deposition (PECVD) or physical vapor deposition (PVD).

The PVD method uses a physical process to deposit the material from a target film. The PVD method may be, for example, electron beam PVD, pulsed laser deposition, sputter deposition, cathodic arc deposition, or other like processes.

The temperature used for the PVD is low. Using a low temperature is advantageous because the magnetic properties of the MTJ begin to degrade at high process temperatures, for example, 300 to 400° C. In some embodiments, the PVD temperature is in a range from about 25 to about 300° C. In other embodiments, the PVD temperature is in a range from about 25 to about 200° C.

The power used for PVD is also low. Using a low power is advantageous because radicals in the plasma too energetic and cause more damage to the junctions when the power is too high. In some embodiments, the PVD power is in a range from about 100 to about 1000 W. In other embodiments, the PVD power is in a range from about 100 to about 300 W.

A PECVD method may also be used to deposit the sacrificial dielectric film 240. PECVD methods introduce reactant gases between a grounded electrode and an RF-energized electrode. The capacitive coupling between the electrodes excites reactant gases into a plasma that produces a chemical reaction product that is deposited on a substrate. The substrate is placed on the grounded electrode and heated to a low temperature. In some embodiments, the PECVD deposition temperature is less than 300° C. In other embodiments, the PECVD deposition temperature is in a range from about 25 to about 400° C.

Various precursors for forming the sacrificial dielectric film 240 may be used and depend on the type of material. In one non-limiting example, silane or dichlorosilane may be used as the silicon source gas. The silane may be combined with an oxygen source gas (e.g., molecular oxygen or nitrous oxide) to form silicon dioxide or a nitrogen gas source (e.g., ammonia or molecular nitrogen) to produce silicon nitride. In another non-limiting example, silicon dioxide may be deposited from a tetraethoxysilane (TEOS) silicon precursor in an oxygen or oxygen-argon plasma.

The power used for PECVD is also low. In some embodiments, the PECVD power is in a range from about 25 to about 1000 W. In other embodiments, the PECVD power is in a range from about 25 to about 500 W.

The thickness of the sacrificial dielectric film 240 may generally vary as it depends on the type of device and material. In some embodiments, the thickness of the sacrificial dielectric film 240 is in a range from about 5 to about 100 nm. In other embodiments, the thickness of the sacrificial dielectric film 240 is in a range from about 20 to about 40 nm.

FIG. 2C is a cross-sectional side view using a directional etch to remove material from the device sidewalls. The direction etch removes the sacrificial dielectric film 240 from the MTJ stack 205 and hard mask 210 sidewalls. The directional etch removes the metal redeposition 220 (shown in FIG. 2B). The metal redeposition 220 is replaced with redeposition from the sacrificial dielectric film 240. In one embodiment, the sidewall of the MTJ stack 205 is substantially free of metal redeposition. In another embodiment, the sidewall of the tunnel barrier layer 203 is substantially free of metal redeposition.

The directional etch also removes sidewall portions of the reference layer 202, tunnel barrier layer 203, free layer 204, and hard mask 210. Removing sidewall portions of the MTJ stack 205 and hard mask 210, thus reduces the size of the device from the initial size 250 to the final desired size 230. Although the etch process is directional and the majority of the material is removed from the sidewalls, a portion of the surface of the sacrificial dielectric film 240 may also be removed.

The directional etch process may be, for example, an IBE process. The directional etch process replaces the metal redeposition 220 with a portion of the sacrificial dielectric film 240. The sacrificial dielectric film 240 is left deposited along sidewalls of the MTJ stack 205. The sacrificial dielectric film 240 may be deposited along sidewalls of the reference layer 202, tunnel barrier layer 203, free layer 204, and/or hard mask 210. Replacing the metal redeposition 220 with the sacrificial dielectric film 240 substantially reduces and/or prevents electrical shorting that may result from metal being deposited on the tunnel barrier layer 203.

FIG. 2D is a cross-sectional side view after depositing an optional encapsulating dielectric layer 260 on the MRAM device. The optional encapsulating dielectric layer 260 protects the device from subsequent processing. The encapsulating dielectric layer 260 covers the surface and sidewalls of the sacrificial dielectric film 240. The encapsulating dielectric layer 260 is disposed on sidewalls of the hard mask 210 and any sidewalls of the MTJ stack 205 that are not covered by the sacrificial dielectric film 240. The encapsulating dielectric layer 260 may cover the redeposited portions of the sacrificial dielectric layer 240. The encapsulating layer 260 is disposed directly on exposed sidewalls of the hard mask 210 and any exposed sidewalls of the MTJ 205.

The encapsulating dielectric layer 260 may be deposited using a deposition process, for example, chemical vapor deposition (CVD) or physical vapor deposition (PVD). Non-limiting examples of materials for the encapsulating dielectric layer 260 include dielectric oxides (e.g., silicon dioxide), dielectric nitrides (e.g., $Si_xN_y$), dielectric oxynitrides (e.g., $SiO_xN_y$), or any combination thereof. The encapsulating dielectric layer 260 may be the same or different than the sacrificial dielectric film 240.

The encapsulating dielectric layer 260 may have a thickness that generally varies and depends on the type of material(s) and the type of device. In some embodiments, the encapsulating dielectric layer 260 has a thickness in a range from about 10 to about 100 nm. In other embodiments, the encapsulating dielectric layer 260 has a thickness in a range from about 20 to about 40 nm.

The device stack may be further processed to form any final structure. For example, an interlayer dielectric (ILD) may be deposited on the encapsulating dielectric layer 260. The ILD may include a low-k dielectric oxide, including but not limited to, silicon dioxide, spin-on-glass, a flowable oxide, a high-density plasma oxide, or any combination thereof. The ILD may be formed by performing deposition process, including, but not limited to CVD, PVD, plasma enhanced CVD, atomic layer deposition (ALD), evaporation, chemical solution deposition, or like processes.

To form a contact, a trench may be etched through the ILD and then filled with a metal(s). The ILD may be etched, for example, using a wet etch chemical process. A metallization process may be employed to deposit a metal into the trench and form a contact. The metal 340 may be deposited by performing a deposition process, for example, CVD, PECVD, PVD, plating, thermal or e-beam evaporation, or sputtering. Non-limiting examples of materials for the metal include copper, aluminum, or any combination thereof.

As described above, various embodiments described herein, in contrast to FIGS. 1A-1C, provide MRAM devices and methods that substantially reduce or eliminate electrical shorting caused by metal redeposition in an ion beam etched MRAM device. The methods and devices also reduce process degradation. In some embodiments, an IBE patterns the device to a larger size than the final desired size. A sacrificial silicon nitride dielectric is deposited using a low power, low temperature plasma enhanced chemical vapor deposition (PECVD) or physical vapor deposition (PVD) process to encapsulate the device. An IBE process "clean-up" process etches the sidewalls of the device stack, substantially leaving the top surface of the stack intact. All of the processes may be performed in-situ in the same multi-chamber process tool. Accordingly, material redeposited from the substrate is a dielectric material, which would not short the tunnel barrier; as opposed to when a metal material is repositioned that may cause a short.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a magnetic random access memory (MRAM) device, the method comprising:

forming a magnetic tunnel junction (MTJ) on an electrode, the MTJ comprising a reference layer disposed in contact with the electrode, a tunnel barrier layer disposed on the reference layer, and a free layer disposed on the tunnel barrier layer;

disposing a hard mask on the MTJ;

etching sidewalls of the hard mask and the MTJ to form a stack with a first width and redeposit a metal along a sidewall of the MTJ;

depositing a sacrificial dielectric layer on a surface of the hard mask, a surface of the electrode, an exposed sidewall of the hard mask and the MTJ, and on redeposited metal positioned along the sidewall of the MTJ; and performing a directional etch to substantially remove the sacrificial dielectric layer from sidewalls of the hard mask and the MTJ, the redeposited metal from sidewalls of the MTJ, and portions of sidewalls of the MTJ and hard mask to provide a second width to the stack;

wherein a top surface of the sacrificial dielectric layer remains substantially intact during the directional etch, and the second width of the stack is less than the first width.

2. The method of claim 1, further comprising depositing an encapsulating dielectric layer on the sacrificial dielectric layer.

3. The method of claim 1, wherein removing a portion of the sacrificial dielectric layer redeposits a portion of the sacrificial dielectric layer on a sidewall of the MTJ.

4. The method of claim 3, further comprising depositing an encapsulating dielectric layer on redeposited portions of the sacrificial dielectric layer.

5. The method of claim 4, wherein the encapsulating dielectric layer is disposed directly on exposed sidewalls of the hard mask.

6. The method of claim 1, wherein the sacrificial dielectric layer is a dielectric oxide a dielectric nitride, a dielectric oxynitride, an aluminum oxide, or any combination thereof.

7. The method of claim 1, wherein depositing the sacrificial dielectric layer comprises using a physical vapor deposition (PVD) method at a temperature in a range from about 25 to about 300° C.

8. The method of claim 1, wherein depositing the sacrificial dielectric layer comprises using a plasma enhanced chemical vapor deposition method (PECVD) to deposit a silicon nitride film.

* * * * *